United States Patent
Kim

(10) Patent No.: US 11,676,804 B2
(45) Date of Patent: Jun. 13, 2023

(54) APPARATUS AND METHOD FOR TREATING SUBSTRATE

(71) Applicant: SEMES CO., LTD., Cheonan-si (KR)

(72) Inventor: Daehyun Kim, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 214 days.

(21) Appl. No.: 16/916,740

(22) Filed: Jun. 30, 2020

(65) Prior Publication Data

US 2021/0005434 A1    Jan. 7, 2021

(30) Foreign Application Priority Data

Jul. 1, 2019   (KR) .................. 10-2019-0078610
Sep. 4, 2019   (KR) .................. 10-2019-0109432

(51) Int. Cl.
*H01J 37/32* (2006.01)
*H01L 21/67* (2006.01)

(52) U.S. Cl.
CPC .. *H01J 37/32724* (2013.01); *H01J 37/32183* (2013.01); *H01J 2237/0203* (2013.01); *H01J 2237/334* (2013.01); *H01L 21/67069* (2013.01)

(58) Field of Classification Search
CPC .......... H01J 37/32183; H01J 37/32724; H01J 2237/0203; H01J 2237/334; H01L 21/67109; H01L 21/6831; H01L 21/67103; H01L 21/67248; H01L 21/67069
See application file for complete search history.

(56) References Cited

U.S. PATENT DOCUMENTS

2011/0126765 A1*   6/2011   Yamazawa ........ H01J 37/32091
                                                      118/723 MW

FOREIGN PATENT DOCUMENTS

| JP | 2019-504481 A | 2/2019 |
| KR | 2009-0129417 A | 12/2009 |
| KR | 10-2013-0106022 A | 9/2013 |
| KR | 2014-0130215 A | 11/2014 |

(Continued)

OTHER PUBLICATIONS

Korean Allowance dated Dec. 1, 2021 issued in corresponding Korean Appln. No. 10-2019-0109432.

(Continued)

*Primary Examiner* — Yuechuan Yu
(74) *Attorney, Agent, or Firm* — Harness, Dickey & Pierce, P.L.C.

(57) ABSTRACT

A substrate treating apparatus includes a chamber having a treatment space therein, a substrate support unit that supports a substrate in the treatment space, a gas supply unit that supplies a gas into the treatment space, and a plasma generation unit including an RF power supply that applies RF power, wherein the plasma generation unit generates plasma from the gas using the RF power. The substrate support unit includes a support plate that supports the substrate and a heating unit that controls temperature of the substrate. The heating unit includes a heating member, a heater power supply that applies power to the heating member, and a filter unit that prevents coupling of the heating member and the RF power supply. The filter unit includes a filter that interrupts the RF power supplied from the RF power supply and a filter control unit that prevents degradation in performance of the filter.

20 Claims, 6 Drawing Sheets

(56) References Cited

FOREIGN PATENT DOCUMENTS

| KR | 10-2016-0012085 A | 2/2016 |
|---|---|---|
| KR | 2017-0039978 A | 4/2017 |
| KR | 10-1743493 B1 | 6/2017 |
| KR | 10-2019-0050656 A | 5/2019 |

OTHER PUBLICATIONS

Korean Office Action dated Jul. 31, 2020 issued in corresponding Korean Appln. No. 10-2019-0109432.
Korean Office Action dated May 17, 2021 issued in corresponding Korean Appln. No. 10-2019-0109432.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Applications No. 10-2019-0078610 and 10-2019-0109432 filed on Jul. 1, 2019 and Sep. 4, 2019, respectively, in the Korean Intellectual Property Office, the entire contents of which are hereby incorporated by reference.

BACKGROUND

Embodiments of the inventive concept described herein relate to an apparatus and method for treating a substrate, and more particularly, relate to a substrate treating apparatus having a filter for preventing coupling of a heater and an RF power supply, and a substrate treating method of the substrate treating apparatus.

To manufacture semiconductor elements, desired patterns are formed on a substrate by performing various processes, such as photolithography, etching, ashing, ion implantation, thin-film deposition, cleaning, and the like, on the substrate. Among these processes, the etching process is a process of removing a selected region of a film formed on the substrate, and wet etching or dry etching is used.

An etching apparatus using plasma is used for dry etching. In general, to form plasma, the etching apparatus forms an electromagnetic field in the interior space of a chamber, and the electromagnetic field excites a process gas in the chamber into a plasma state.

Plasma refers to an ionized gaseous state of matter containing ions, electrons, and radicals. Plasma is generated by heating a neutral gas to a very high temperature or subjecting the neutral gas to a strong electric field or an RF electromagnetic field. A semiconductor element manufacturing process performs an etching process using plasma. The etching process is performed by collision of ion particles contained in the plasma with a substrate. At this time, coupling may be generated between RF power supplied from an RF power supply for generating plasma and a heating member for heating the substrate, and to prevent the coupling, an interruption filter may be used for the heating member. However, in a case where the interruption filter is connected to a chamber, the interruption filter's performance may be degraded by an impedance change of the chamber, and a voltage change of a lower electrode by the interruption filter and a connecting cable between the interruption filter and an electrostatic chuck may have an influence on a process.

SUMMARY

Embodiments of the inventive concept provide a substrate treating apparatus and method for preventing degradation in performance of a coupling interruption filter.

In addition, embodiments of the inventive concept provide a substrate treating apparatus and method for reducing a process deviation by reducing an insulator collision deviation of ions between chambers by compensating for an electrostatic-chuck voltage (bias voltage) deviation between the chambers trough a coupling interruption filter.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an exemplary embodiment, an apparatus for treating a substrate includes a chamber having a treatment space therein, a substrate support unit that supports the substrate in the treatment space, a gas supply unit that supplies a gas into the treatment space, and a plasma generation unit including an RF power supply that applies RF power, in which the plasma generation unit generates plasma from the gas by using the RF power. The substrate support unit includes a support plate that supports the substrate and a heating unit that controls temperature of the substrate. The heating unit includes a heating member, a heater power supply that applies power to the heating member, and a filter unit that prevents coupling of the heating member and the RF power supply. The filter unit includes a filter that interrupts the RF power supplied from the RF power supply and a filter control unit that prevents degradation in performance of the filter.

The filter control unit may include a first variable element connected with the filter in series, a second variable element connected with the filter in parallel, and a controller that adjusts impedance values of the first variable element and the second variable element.

The controller may compensate for a change in impedance of the plasma generation unit by the filter unit, by adjusting the impedance value of the first variable element.

The controller may adjust a resonance point of the filter unit by adjusting the impedance value of the second variable element.

The first variable element and the second variable element may be variable capacitors.

The filter may include an inductor and a capacitor connected together in parallel. The second variable element may be connected with the inductor and the capacitor in parallel, and the first variable element may be connected with the inductor, the capacitor, and the second variable element in series.

The heating unit may further include a voltage measurement member that measures voltage of a lower electrode to which the RF power is applied, and the controller may adjust the impedance values of the first variable element and the second variable element, based on the voltage of the lower electrode.

The controller may perform control such that the voltage of the lower electrode has a preset value, by adjusting the impedance values of the first variable element and the second variable element.

The heater power supply may be an alternating current (AC) power supply.

The filter unit may further include a heater power supply filter that is provided between the filter and the heater power supply and that interrupts a preset frequency range in power supplied from the heater power supply.

The heater power supply filter may include an inductor and a capacitor connected together in parallel.

The first variable element and the second variable element may be provided in plural.

According to an exemplary embodiment, an apparatus for treating a substrate includes a chamber having a treatment space therein, a substrate support unit that supports the substrate in the treatment space, a gas supply unit that supplies a gas into the treatment space, and a plasma generation unit including an RF power supply that applies RF power, in which the plasma generation unit generates plasma from the gas by using the RF power. The substrate support unit includes a support plate that supports the substrate and a heating unit that controls temperature of the substrate. The heating unit includes a heating member, a heater power supply that applies power to the heating member, and a filter unit including first and second terminals connected to the heating member and third and fourth terminals connected to the heater power supply. The filter unit includes a first variable element having one end connected to the first terminal and an opposite end grounded, a second variable element having one end connected to the second terminal and an opposite end grounded, a third variable element, a first capacitor, and a first inductor connected in parallel between the first terminal and a first node, a fourth variable element, a second capacitor, and a second inductor connected in parallel between the second terminal and a second node, a third inductor connected between the first node and the third terminal, a fourth inductor connected between the second node and the fourth terminal, a third capacitor having one end connected to the third terminal and an opposite end grounded, and a fourth capacitor having one end connected to the fourth terminal and an opposite end grounded.

According to an embodiment, the apparatus may further include a controller that adjusts capacitance values of the first to fourth variable elements.

According to an exemplary embodiment, provided is a substrate treating method of the apparatus. In the substrate treating method, a change in impedance of the plasma generation unit by the filter unit is compensated for by adjusting the impedance value of the first variable element.

A resonance point of the filter unit may be adjusted by adjusting the impedance value of the second variable element.

Voltage of a lower electrode to which the RF power is applied may be measured, and the impedance values of the first variable element and the second variable element may be adjusted based on the measured voltage of the lower electrode.

The voltage of the lower electrode may be controlled to a preset value, by adjusting the impedance values of the first variable element and the second variable element.

An etch rate of the apparatus may be adjusted by adjusting the impedance values of the first variable element and the second variable element.

The first variable element and the second variable element may be variable capacitors.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Other advantages and features of the inventive concept, and implementation methods thereof will be clarified through the following embodiments to be described in detail with reference to the accompanying drawings. The inventive concept may, however, be embodied in different forms and should not be construed as being limited to the embodiments set forth herein. Rather, these embodiments are provided so that this disclosure is thorough and complete and fully conveys the scope of the inventive concept to a person skilled in the art to which the inventive concept pertains. Further, the inventive concept is only defined by the appended claims.

Even though not defined, all terms used herein (including technical or scientific terms) have the same meanings as those generally accepted by general technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

Terms used herein are only for description of embodiments and are not intended to limit the inventive concept. As used herein, the singular forms are intended to include the plural forms as well, unless context clearly indicates otherwise. It will be further understood that the terms "comprise" and/or "comprising" used herein specify the presence of stated features or components, but do not preclude the presence or addition of one or more other features or components. In the specification, the term "and/or" indicates each of listed components or various combinations thereof.

Figure 1:
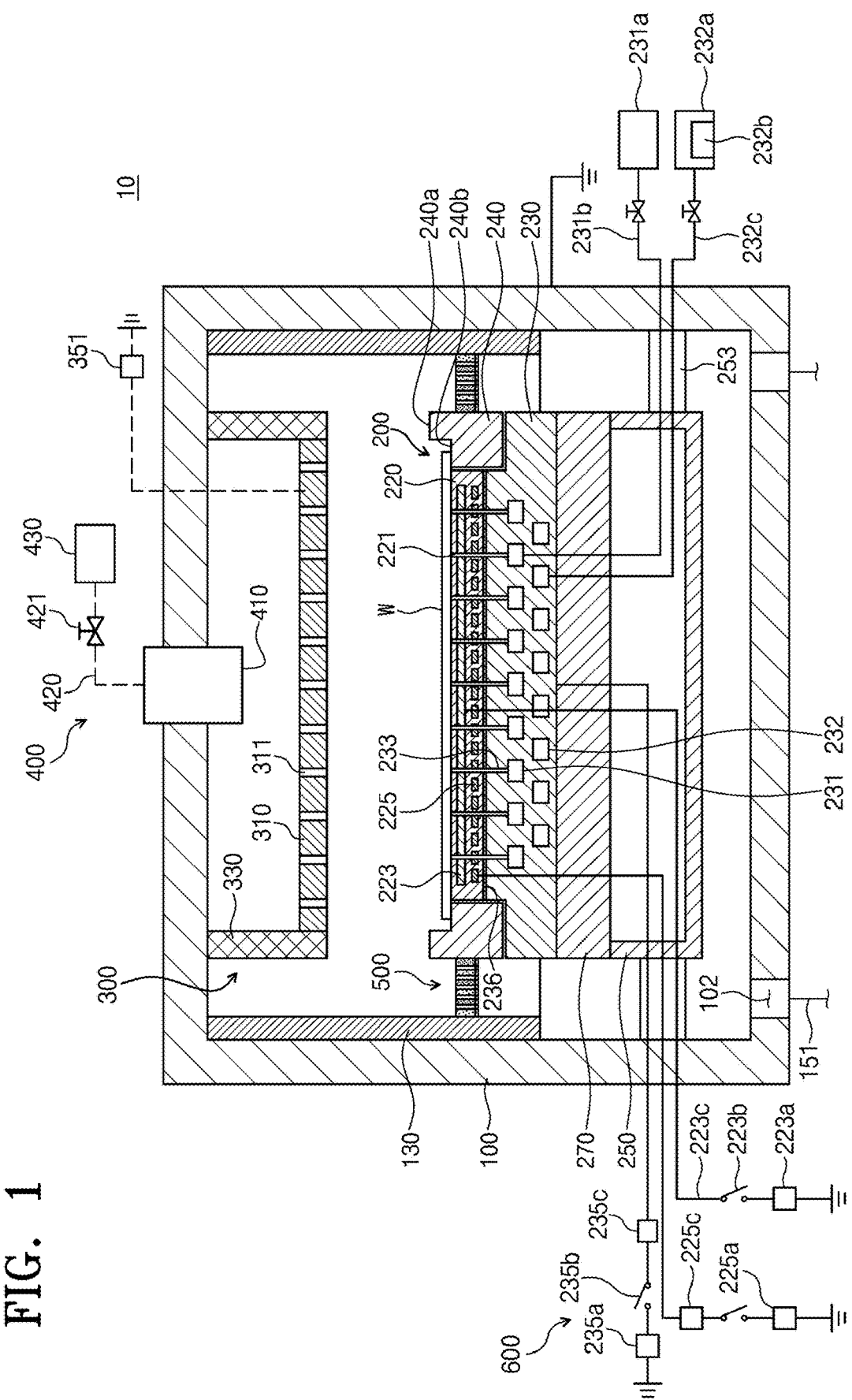
FIG. 1 is a sectional view illustrating a substrate treating apparatus according to an embodiment of the inventive concept.

FIG. 1 is a sectional view illustrating a substrate treating apparatus 10 according to an embodiment of the inventive concept.

Referring to FIG. 1, the substrate treating apparatus 10 treats a substrate W using plasma. For example, the substrate treating apparatus 10 may perform an etching process on the substrate W. The substrate treating apparatus 10 may include the chamber 100, the substrate support unit 200, a showerhead 300, a gas supply unit 400, a baffle unit 500, and a plasma generation unit 600.

The chamber 100 may have a treatment space therein in which a substrate treating process is performed. The chamber 100 may have the treatment space therein and may be provided in an enclosed shape. The chamber 100 may be formed of a metallic material. According to an embodiment, the chamber 100 may be formed of an aluminum material. The chamber 100 may be grounded. The chamber 100 may have an exhaust hole 102 formed in the bottom thereof. The exhaust hole 102 may be connected with an exhaust line 151. Reaction byproducts generated in the substrate treating process and gases staying in the interior space of the chamber 100 may be released to the outside through the exhaust line 151. The pressure in the chamber 100 may be reduced to a predetermined pressure by the exhaust process.

According to an embodiment, a liner 130 may be provided inside the chamber 100. The liner 130 may have a cylindrical shape that is open at the top and the bottom. The liner 130 may make contact with an inner surface of the chamber 100. The liner 130 may protect the inner wall of the chamber 100 to prevent the inner wall of the chamber 100 from being damaged by arc discharge. Furthermore, the liner 130 may prevent impurities generated during the substrate treating process from being deposited on the inner wall of the chamber 100. Selectively, the liner 130 may not be provided.

The substrate support unit 200 may be located inside the chamber 100. The substrate support unit 200 may support the substrate W. The substrate support unit 200 may include an electrostatic chuck that clamps the substrate W using an electrostatic force. Alternatively, the substrate support unit 200 may support the substrate W in various manners such as mechanical clamping. Hereinafter, the substrate support unit 200 including the electrostatic chuck will be described.

The substrate support unit 200 may include the electrostatic chuck, a lower cover 250, and a plate 270. Inside the chamber 100, the substrate support unit 200 is located to be spaced apart upward from the bottom of the chamber 100.

The electrostatic chuck may include a dielectric plate 220, a body 230, and a ring assembly 240. The dielectric plate 220 may be formed of a dielectric substance in a circular plate shape. The substrate W may be placed on an upper surface of the dielectric plate 220. The upper surface of the dielectric plate 220 may have a smaller radius than the substrate W. An edge region of the substrate W may be located outside the dielectric plate 220.

The dielectric plate 220 may include a first electrode 223, a heating member 225, and a first supply passage 221 inside. The first supply passage 221 may extend from the upper surface of the dielectric plate 220 to a lower surface thereof. A plurality of first supply passages 221 may be formed to be spaced apart from each other and may serve as passages through which a heat transfer medium is supplied to a bottom surface of the substrate W.

The first electrode 223 may be electrically connected with a first power supply 223a. The first power supply 223a may include a direct current (DC) power supply. A switch 223b may be installed between the first electrode 223 and the first power supply 223a. The first electrode 223 may be electrically connected with the first power supply 223a by turning on/off the switch 223b. When the switch 223b is turned on, DC current may be applied to the first electrode 223. An electrostatic force may act between the first electrode 223 and the substrate W by the current applied to the first electrode 223, and the substrate W may be clamped to the dielectric plate 220 by the electrostatic force.

The heating member 225 may be located under the first electrode 223. The heating member 225 may be electrically connected with a heater power supply 225a. The heater power supply 225a may be an alternating current (AC) power supply. The heating member 225 may generate heat by resisting electric current applied by the heater power supply 225a. The generated heat may be transferred to the substrate W through the dielectric plate 220. The substrate W may be maintained at a predetermined temperature by the heat generated from the heating member 225. The heating member 225 may include a spiral coil.

The body 230 may be located under the dielectric plate 220. The lower surface of the dielectric plate 220 and an upper surface of the body 230 may be bonded together by an adhesive 236. The body 230 may be formed of an aluminum material. The upper surface of the body 230 may have a step such that a central region of the upper surface of the body 230 is located in a higher position than an edge region of the upper surface of the body 230. The central region of the upper surface of the body 230 may have an area corresponding to the lower surface of the dielectric plate 220 and may be bonded to the lower surface of the dielectric plate 220.

The body 230 may have a first circulation passage 231, a second circulation passage 232, and a second supply passage 233 formed therein.

The first circulation passage 231 may serve as a passage through which the heat transfer medium circulates. The first circulation passage 231 may be formed in a spiral shape inside the body 230. Alternatively, the first circulation passage 231 may be implemented with ring-shaped passages that have different radii and that are concentric with one another. The first circulation passages 231 may be connected together. The first circulation passages 231 may be formed at the same height.

The second circulation passage 232 may serve as a passage through which a cooling fluid circulates. The second circulation passage 232 may be formed in a spiral shape inside the body 230. Alternatively, the second circulation passage 232 may be implemented with ring-shaped passages that have different radii and that are concentric with one another. The second circulation passages 232 may be connected together. The second circulation passages 232 may have a larger cross-sectional area than the first circulation passages 231. The second circulation passages 232 may be formed at the same height. The second circulation passages 232 may be located under the first circulation passages 231.

The second supply passage 233 may extend upward from the first circulation passages 231 to the upper surface of the body 230. As many second supply passages 233 as the first supply passages 221 may be provided. The second supply passages 233 may connect the first circulation passages 231 and the first supply passages 221.

The first circulation passages 231 may be connected with a heat transfer medium reservoir 231a through a heat transfer medium supply line 231b. The heat transfer medium may be stored in the heat transfer medium reservoir 231a. The heat transfer medium may include an inert gas. According to an embodiment, the heat transfer medium may include a helium (He) gas. The helium gas may be supplied into the first circulation passages 231 through the heat transfer medium supply line 231b and then supplied to the bottom surface of the substrate W via the second supply passages 233 and the first supply passages 221. The helium gas serves as a medium through which heat transferred from plasma to the substrate W is transferred to the electrostatic chuck.

The second circulation passages 232 may be connected with a cooling fluid reservoir 232a through a cooling fluid supply line 232c. The cooling fluid may be stored in the cooling fluid reservoir 232a. The cooling fluid reservoir 232a may include a cooler 232b therein. The cooler 232b may cool the cooling fluid to a predetermined temperature. Alternatively, the cooler 232b may be installed on the cooling fluid supply line 232c. The cooling fluid supplied into the second circulation passages 232 through the cooling fluid supply line 232c may cool the body 230 while circulating along the second circulation passages 232. The body 230, while being cooled, may cool the dielectric plate 220 and the substrate W together to maintain the substrate W at a predetermined temperature.

The body 230 may include a metal plate. According to an embodiment, the entire body 230 may be implemented with a metal plate. The body 230 may be electrically connected with a third power supply 235a. The third power supply 235a may be a high-frequency power supply that generates high-frequency power. The high-frequency power supply may be an RF power supply. The body 230 may receive RF power from the third power supply 235a. Due to this, the body 230 may function as an electrode.

The ring assembly 240 has a ring shape. The ring assembly 240 surrounds the periphery of the dielectric plate 220. The ring assembly 240 supports the edge region of the substrate W. According to an embodiment, the ring assembly 240 has a focus ring 240b and an insulating ring 240a. The focus ring 240b surrounds the dielectric plate 220 and concentrates plasma on the substrate W. The insulating ring 240a surrounds the focus ring 240b. Selectively, the ring assembly 240 may include an edge ring (not illustrated) that is brought into close contact with the periphery of the focus ring 240b to prevent a side surface of the dielectric plate 220 from being damaged by plasma. Unlike the above description, the structure of the ring assembly 240 may be changed in various ways.

Figure 2:
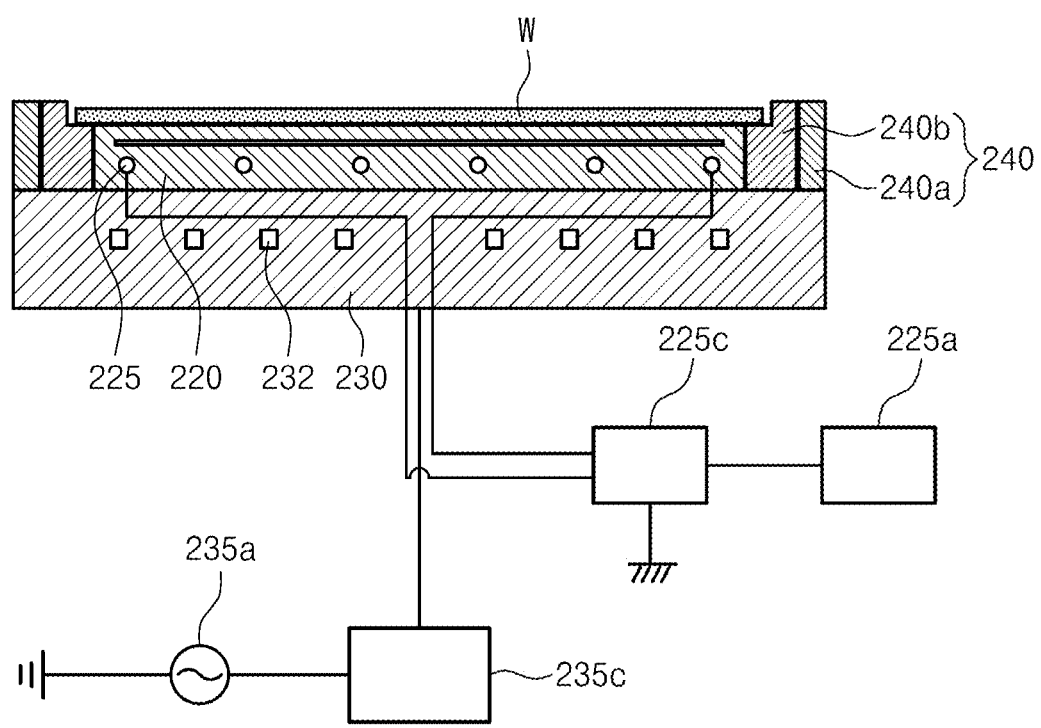
FIG. 2 is a detailed sectional view illustrating a substrate support unit in the substrate treating apparatus of FIG. 1.

FIG. 2 is a detailed sectional view illustrating the substrate support unit in the substrate treating apparatus of FIG. 1.

Referring to FIG. 2, a filter unit 225c is located between the heating member 225 and the heater power supply 225a. The heating member 225 maintains the substrate W at a process temperature while a process is performed. The heating member 225 may be implemented with a heating wire. The heating member 225, the heater power supply 225a, and the filter unit 225c constitute a heating unit that controls the temperature of the substrate W.

As described above, the third power supply 235a may be implemented with an RF power supply that generates RF power, and a matcher 235c may be connected between the body 230 functioning as an electrode and the third power supply 235a.

The filter unit 225c prevents coupling between the heating member 225 and the RF power supply 235a. Specifically, coupling may be generated by RF power supplied by the RF power supply 235a and AC power supplied by the heater power supply 225a, and the filter unit 225c may prevent the coupling between the RF power and the AC power. For example, the filter unit 225c may interrupt introduction of the RF power of the RF power supply 235a into the heater power supply 225a and may prevent coupling between the heater power supply 225a and the RF power supply 235a.

Figure 3:
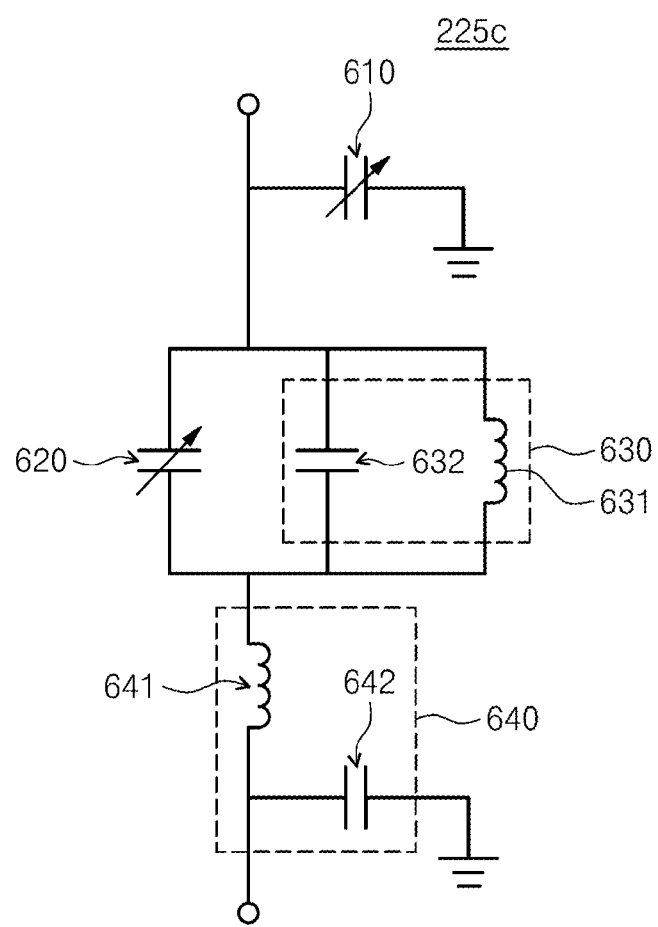
FIG. 3 is a circuit diagram illustrating a filter unit according to an embodiment of the inventive concept.

Hereinafter, a structure of the filter unit 225c according to an embodiment of the inventive concept will be described in detail with reference to FIG. 3. The filter unit 225c includes a filter control unit 610 and 620, a filter 630, and a heater power supply filter 640.

The filter control unit 610 and 620 may prevent degradation in performance of the filter 630. The filter control unit 610 and 620 includes the first variable element 610, the second variable element 620, and a controller (not illustrated). The first variable element 610 is connected with the filter 630 in series. The first variable element 610 may be implemented with a variable capacitor. The impedance (capacitance) of the first variable element 610 may be adjusted by the controller (not illustrated) to compensate for an impedance change of the plasma generation unit 600 by the filter unit 225c. Specifically, the filter unit 225c may include a cable connecting the electrostatic chuck and the filter unit 225c. The impedance change of the plasma generation unit 600 may be generated by the cable connecting the filter unit 225c and the electrostatic chuck. In this case, the first variable element 610 may adjust the impedance (capacitance) to compensate for the impedance change of the plasma generation unit 600 by the cable of the filter unit 225c.

The second variable element 620 is connected with the filter 630 in parallel. The second variable element 620 may be implemented with a variable capacitor. The impedance (capacitance) of the second variable element 620 may be adjusted by the controller (not illustrated) to adjust a resonance point of the filter unit 225c. The controller (not illustrated) may adjust the impedances (capacitances) of the first variable element 610 and the second variable element 620. For example, in a case where the same etch rate has to be provided in a plurality of chambers in which etching processes are performed, the controller (not illustrated) of the filter unit 225c provided in each of the chambers may adjust the capacitance of the first variable capacitor 610 to compensate for an impedance change of the plasma generation unit 600, or may adjust the capacitance of the second variable capacitor 620 to adjust a resonance point of the filter unit 225c. The controller (not illustrated) may adjust etch rates in the plurality of chambers depending on a change in the resonance point of the filter unit 225c.

The etch rates in the plurality of chambers may be adjusted by adjusting current flowing through each electrode in the plasma generation unit 600 and a resonance point for a capacitance value.

The filter 630 interrupts RF power supplied from the RF power supply 235a. The filter 630 may be implemented with, but is not limited to, a band reject filter. The filter 630 may include an inductor 631 and a capacitor 632. The inductor 631 and the capacitor 632 of the filter 630 may be connected with each other in parallel. For example, the inductor 631 and the capacitor 632 of the filter 630 may be connected together in parallel, the second variable element 620 may be connected in parallel with the filter 630 in which the inductor 631 and the capacitor 632 are connected together in parallel, and the first variable element 610 may be connected in series with the circuit in which the second variable element 620, the inductor 631, and the capacitor 632 are connected together in parallel.

The heater power supply filter 640 interrupts a preset frequency range in power supplied from the heater power supply 225a. The heater power supply filter 640 may be implemented with, but is not limited to, a low-pass filter. The heater power supply filter 640 may include an inductor 641 and a capacitor 642 connected with each other in parallel.

Figure 4:
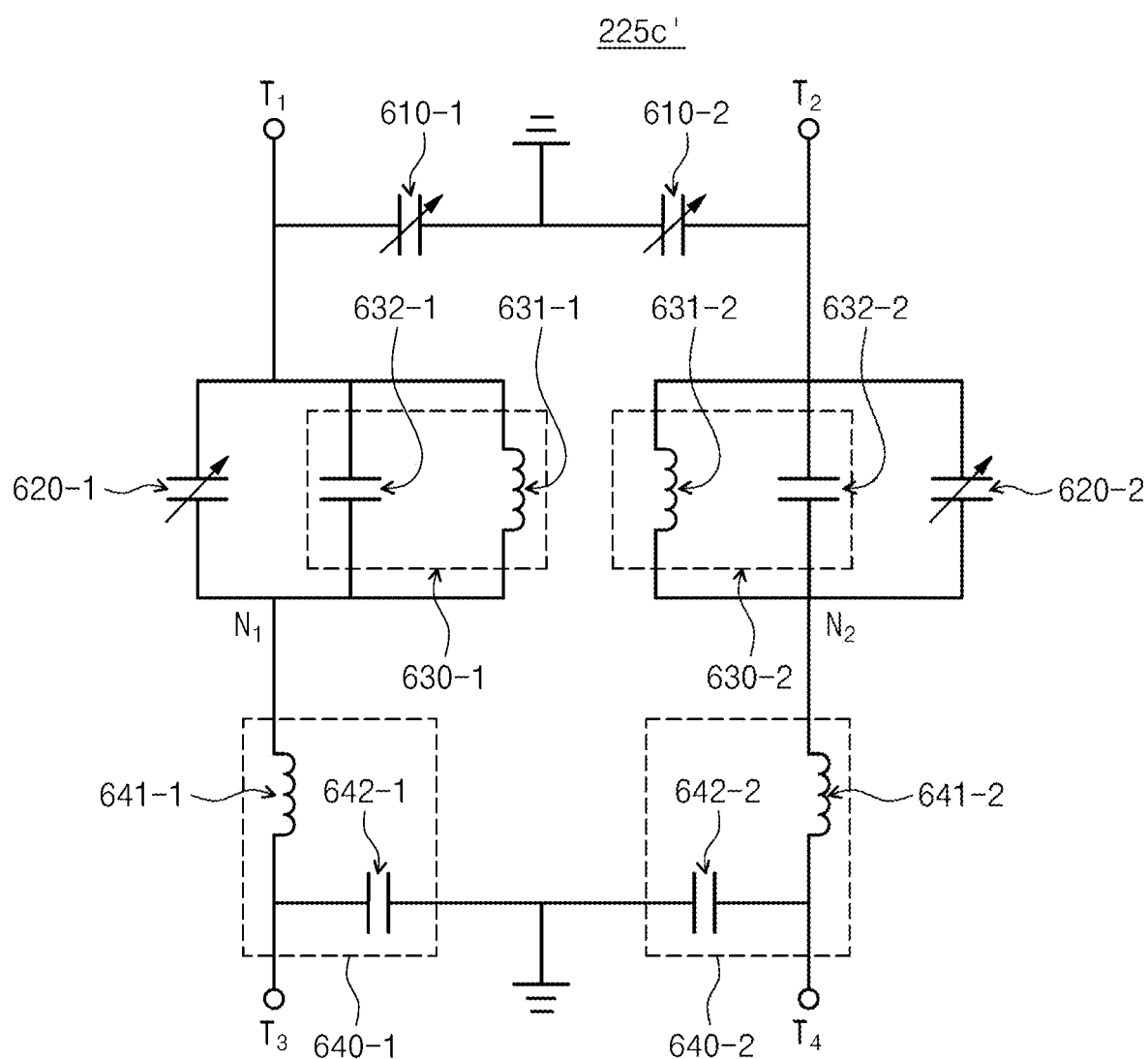
FIG. 4 is a circuit diagram illustrating a filter unit according to another embodiment of the inventive concept.

Referring to FIG. 4, a filter unit 225c' according to another embodiment of the inventive concept may include first variable elements 610-1 and 610-2, second variable elements 620-1 and 620-2, filters 630-1 and 630-2, and heater power supply filters 640-1 and 640-2. A controller (not illustrated) may adjust the capacitances of the first variable elements 610-1 and 610-2 to compensate for an electrostatic-chuck voltage (bias voltage) change of the plasma generation unit 600, or may adjust the capacitances of the second variable elements 620-1 and 620-2 to adjust resonance points of the filters 630-1 and 630-2, thereby preventing degradation in performance of the filters 630-1 and 630-2.

The filter unit 225c' may include terminals T1, T2, T3, and T4. The terminals T1 and T2 may be connected to the heating member 225, and the terminals T3 and T4 may be connected to the heater power supply 225a. The variable element 610-1 may be connected between the terminal T1 and a ground. One end of the variable element 610-1 may be connected to the terminal T1, and an opposite end of the variable element 610-1 may be grounded. The variable element 610-2 may be connected between the terminal T2 and the ground. One end of the variable element 610-2 may be connected to the terminal T2, and an opposite end of the variable element 610-2 may be grounded. The variable element 620-1, a capacitor 632-1, and an inductor 631-1 may be connected together in parallel between the terminal T1 and a node N1. The variable element 620-2, a capacitor 632-2, and an inductor 631-2 may be connected together in parallel between the terminal T2 and a node N2. An inductor 641-1 may be connected between the node N1 and the terminal T3. An inductor 641-2 may be connected between the node N2 and the terminal T4. The capacitor 642-1 may be connected between the terminal T3 and a ground. One end of the capacitor 642-1 may be connected to the terminal T3, and an opposite end of the capacitor 642-1 may be grounded. The capacitor 642-2 may be connected between the terminal T4 and the ground. One end of the capacitor 642-2 may be connected to the terminal T4, and an opposite end of the capacitor 642-2 may be grounded. The ground to which the variable elements 610-1 and 610-2 are commonly connected and the ground to which the capacitors 642-1 and 642-2 are commonly connected may be independent of each other as illustrated in FIG. 4, or may be implemented with a ground in common (that is, a single ground).

Figure 5:
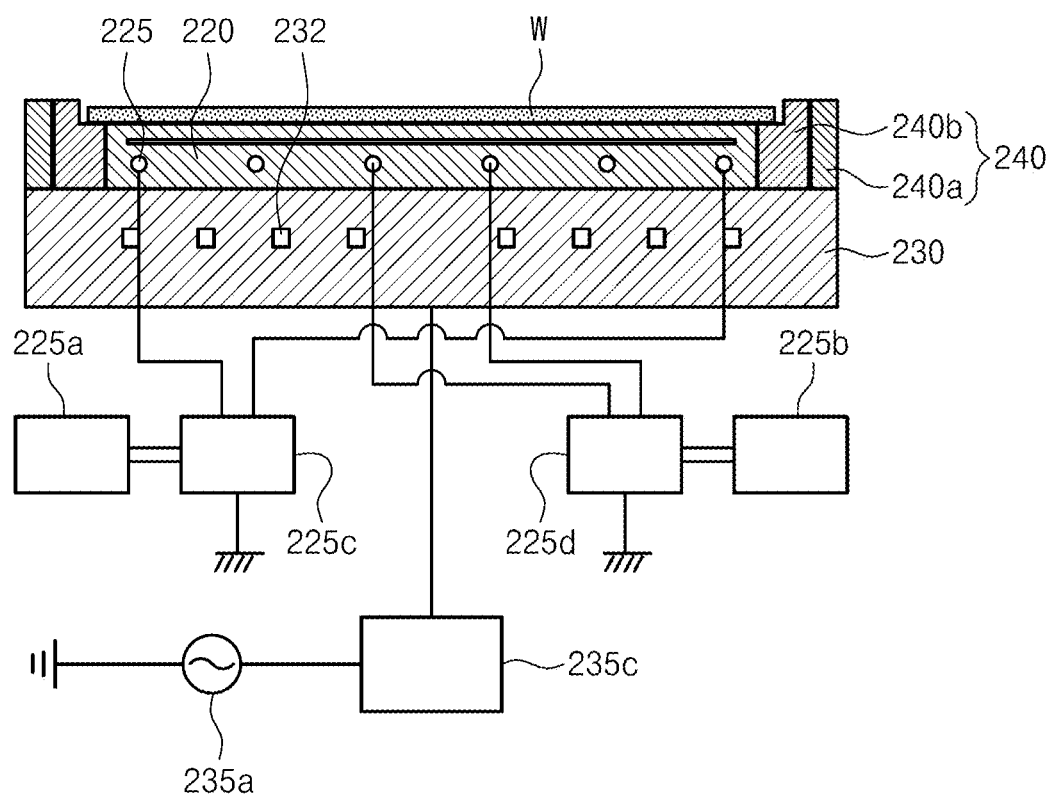
FIG. 5 is a sectional view illustrating a substrate support unit according to another embodiment of the inventive concept.

As illustrated in FIG. 5, a plurality of heater power supplies 225a and 225b may be connected to a plurality of heating members 225 provided in different positions for temperature control for respective regions of a substrate, and a plurality of filter units 225c and 225d may be connected to the plurality of heater power supplies 225a and 225b, respectively.

As described above, a third power supply 235a may be implemented with an RF power supply that generates RF power, and a body 230 may function as an electrode (hereinafter, the body 230 is referred to as the lower electrode 230). The lower electrode 230 receives RF power from the third power supply 235a and generates plasma in the treatment space of the chamber 100. The lower electrode 230 may be equipped with a voltage measurement member (not illustrated) that measures the voltage of the lower electrode 230. A controller (not illustrated) of the filter unit 225c may adjust the impedances of a first variable element 610 and a second variable element 620, based on the voltage of the lower electrode 230 that is measured by the voltage measurement member (not illustrated). Furthermore, by controlling the impedances of the first variable element 610 and the second variable element 620, the controller (not illustrated) may perform control such that the voltage of the lower electrode 230 has a preset value. For example, when an optimal value of the voltage of the lower electrode 230 is set based on an etch rate of the chamber 100, the controller (not illustrated) may perform control such that the voltage of the lower electrode 230 has the optimal value, by adjusting the impedances of the first variable element 610 and the second variable element 620. Accordingly, an effect of the filter unit 225c on a process may be minimized, and a process deviation between a plurality of chambers may be reduced.

Figure 6:
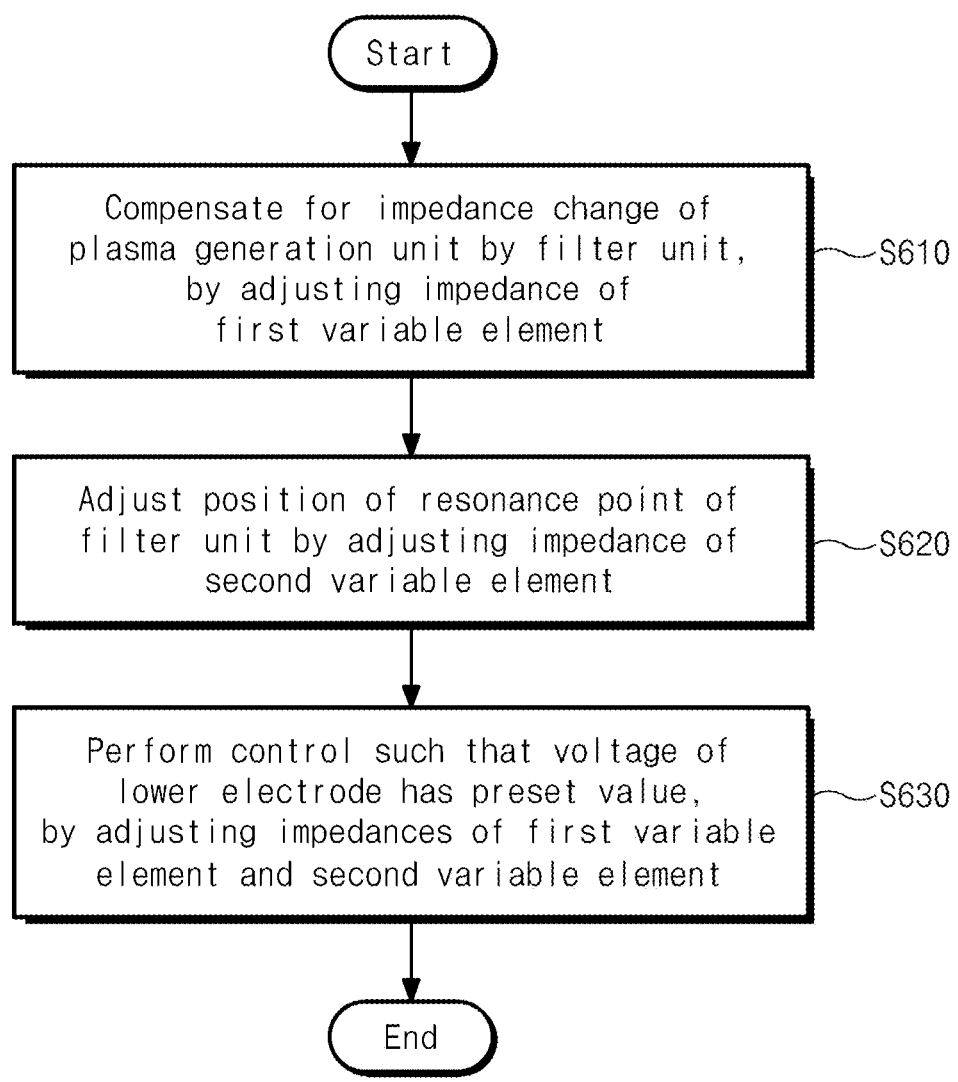
FIG. 6 is a flowchart illustrating a substrate treating method according to an embodiment of the inventive concept.

FIG. 6 is a flowchart illustrating a substrate treating method according to an embodiment of the inventive concept.

Referring to FIG. 6, first, an impedance change of a plasma generation unit by a filter unit is compensated for by adjusting the impedance of a first variable element (S610). Next, a resonance point of the filter unit is adjusted by adjusting the impedance of a second variable element (S620). Then, the voltage of a lower electrode is controlled to a preset value, by adjusting the impedances of the first variable element and the second variable element (S630). Furthermore, the voltage of the lower electrode to which RF power is applied may be measured, and the impedances of the first variable element and the second variable element may be adjusted based on the measured voltage of the lower electrode. Moreover, an etch rate of a substrate treating apparatus may be adjusted by adjusting the impedances of the first variable element and the second variable element. Accordingly, a process deviation between a plurality of chambers may be prevented.

According to the various embodiments of the inventive concept described above, by adjusting the impedances of the first variable element and the second variable element, degradation in performance of the filter unit may be prevented, and an effect of the filter unit on a process in the substrate treating apparatus may be minimized.

Hereinabove, it has been exemplified that an etching process is performed by using plasma. Without being limited thereto, however, the substrate treating process may be applied to various substrate treating processes (e.g., a deposition process, an ashing process, a cleaning process, and the like) that use plasma. Furthermore, it has been exemplified that the plasma generation unit is implemented with a capacitively coupled plasma source. However, the plasma generation unit may be implemented with an inductively coupled plasma (ICP) source. The ICP source may include an antenna.

As described above, according to the various embodiments of the inventive concept, an effect of an interruption filter on a process may be minimized without degradation in performance of the interruption filter.

Effects of the inventive concept are not limited to the aforementioned effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. For example, the components illustrated in the embodiments of the inventive concept can be implemented in a distributed manner. Likewise, the components described to be distributed can be implemented in a combined manner. Accordingly, the spirit and scope of the inventive concept should be determined by the technical idea of the claims, and it should be understood that the spirit and scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a chamber having a treatment space therein;
   a substrate support unit configured to support the substrate in the treatment space;
   a gas supply unit configured to supply a gas into the treatment space; and
   a plasma generation unit including an RF power supply configured to apply RF power, the plasma generation unit being configured to generate plasma from the gas by using the RF power,
   wherein the substrate support unit includes:

a support plate configured to support the substrate; and
a heating unit configured to control temperature of the substrate,
wherein the heating unit includes:
a heating member;
a heater power supply configured to apply power to the heating member; and
a filter unit configured to prevent coupling of the heating member and the RF power supply,
wherein the filter unit includes:
a filter configured to interrupt the RF power supplied from the RF power supply;
a filter control unit configured to prevent degradation in performance of the filter,
wherein the filter control unit includes:
a first variable element connected with the filter in series, and
a second variable element connected with the filter in parallel.

2. The apparatus of claim 1, wherein the filter control unit further includes:
a controller configured to adjust impedance values of the first variable element and the second variable element.

3. The apparatus of claim 2, wherein the controller compensates for a change in impedance of the plasma generation unit by the filter unit, by adjusting the impedance value of the first variable element.

4. The apparatus of claim 3, wherein the controller adjusts a resonance point of the filter unit by adjusting the impedance value of the second variable element.

5. The apparatus of claim 4, wherein the first variable element and the second variable element are variable capacitors.

6. The apparatus of claim 5, wherein the filter includes an inductor and a capacitor connected together in parallel,
wherein the second variable element is connected with the inductor and the capacitor in parallel, and
wherein the first variable element is connected with the inductor, the capacitor, and the second variable element in series.

7. The apparatus of claim 2, wherein the heating unit further includes a voltage measurement member configured to measure voltage of a lower electrode to which the RF power is applied, and
wherein the controller adjusts the impedance values of the first variable element and the second variable element, based on the voltage of the lower electrode.

8. The apparatus of claim 7, wherein the controller performs control such that the voltage of the lower electrode has a preset value, by adjusting the impedance values of the first variable element and the second variable element.

9. The apparatus of claim 2, wherein the heater power supply is an alternating current (AC) power supply.

10. The apparatus of claim 9, wherein the filter unit further includes a heater power supply filter provided between the filter and the heater power supply and configured to interrupt a preset frequency range in power supplied from the heater power supply.

11. The apparatus of claim 10, wherein the heater power supply filter includes an inductor and a capacitor connected together in parallel.

12. The apparatus of claim 5, wherein the first variable element and the second variable element are provided in plural.

13. An apparatus for treating a substrate, the apparatus comprising:
a chamber having a treatment space therein;
a substrate support unit configured to support the substrate in the treatment space;
a gas supply unit configured to supply a gas into the treatment space; and
a plasma generation unit including an RF power supply configured to apply RF power, the plasma generation unit being configured to generate plasma from the gas by using the RF power,
wherein the substrate support unit includes:
a support plate configured to support the substrate; and
a heating unit configured to control temperature of the substrate,
wherein the heating unit includes:
a heating member;
a heater power supply configured to apply power to the heating member; and
a filter unit including first and second terminals connected to the heating member and third and fourth terminals connected to the heater power supply, and
wherein the filter unit includes:
a first variable element having one end connected to the first terminal and an opposite end grounded;
a second variable element having one end connected to the second terminal and an opposite end grounded;
a third variable element, a first capacitor, and a first inductor connected in parallel between the first terminal and a first node;
a fourth variable element, a second capacitor, and a second inductor connected in parallel between the second terminal and a second node;
a third inductor connected between the first node and the third terminal;
a fourth inductor connected between the second node and the fourth terminal;
a third capacitor having one end connected to the third terminal and an opposite end grounded; and
a fourth capacitor having one end connected to the fourth terminal and an opposite end grounded.

14. The apparatus of claim 13, further comprising:
a controller configured to adjust capacitance values of the first to fourth variable elements.

15. A substrate treating method of the apparatus of claim 2, wherein a change in impedance of the plasma generation unit by the filter unit is compensated for by adjusting the impedance value of the first variable element.

16. The substrate treating method of claim 15, wherein a resonance point of the filter unit is adjusted by adjusting the impedance value of the second variable element.

17. The substrate treating method of claim 16, wherein voltage of a lower electrode to which the RF power is applied is measured, and the impedance values of the first variable element and the second variable element are adjusted based on the measured voltage of the lower electrode.

18. The substrate treating method of claim 17, wherein the voltage of the lower electrode is controlled to a preset value, by adjusting the impedance values of the first variable element and the second variable element.

19. The substrate treating method of claim 17, wherein an etch rate of the apparatus is adjusted by adjusting the impedance values of the first variable element and the second variable element.

20. The substrate treating method of claim 17, wherein the first variable element and the second variable element are variable capacitors.

* * * * *